United States Patent

Kang et al.

Patent Number: 6,114,084
Date of Patent: Sep. 5, 2000

[54] CHEMICALLY AMPLIFIED RESIST COMPOSITION

[75] Inventors: Yool Kang; Sang-Jun Choi, both of Kyunggi-do; Dong-Won Jung, Seoul; Chun-Geun Park, Kyunggi-do; Young-Bum Koh, Seoul, all of Rep. of Korea

[73] Assignee: Samsung Electronics Co. Ltd., Kyunggi Do, Rep. of Korea

[21] Appl. No.: 09/165,061

[22] Filed: Oct. 2, 1998

Related U.S. Application Data

[63] Continuation-in-part of application No. 08/805,212, Feb. 27, 1997.

[30] Foreign Application Priority Data

Oct. 2, 1997 [KR] Rep. of Korea .................. 97-51055

[51] Int. Cl.⁷ .................................................. G03C 1/492
[52] U.S. Cl. .................. 430/270.1; 526/271; 526/281; 526/328
[58] Field of Search .................................. 526/271, 281, 526/328; 430/270.1

[56] References Cited

U.S. PATENT DOCUMENTS

| | | | |
|---|---|---|---|
| 5,212,043 | 5/1993 | Yamamoto et al. | 430/192 |
| 5,780,565 | 7/1998 | Clough et al. | 526/206 |
| 5,843,624 | 12/1998 | Houlihan et al. | 430/296 |

*Primary Examiner*—Helen L. Pezzuto
*Attorney, Agent, or Firm*—Skjerven, Morrill, MacPherson LLP

[57] ABSTRACT

Copolymers and terpolymers are used in chemically amplified resists. The terpolymers are of the formula:

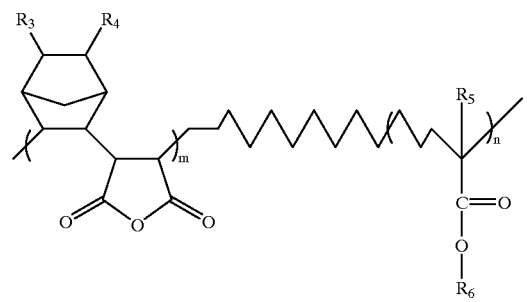

wherein $R_3$ is selected from the group consisting of hydrogen and a $C_1$ to $C_{10}$ aliphatic hydrocarbon, wherein said aliphatic hydrocarbon contains substituents selected from the group consisting of hydrogen, hydroxy, carboxylic acid, carboxylic anhydride, and combinations thereof; $R_4$ is selected from the group consisting of hydrogen and a $C_1$ to $C_{10}$ aliphatic hydrocarbon, wherein said aliphatic hydrocarbon contains substituents selected from the group consisting of hydrogen, hydroxy, carboxylic acid, carboxylic anhydride, and combinations thereof, $R_5$ is selected from the group consisting of hydrogen and methyl; $R_6$ is selected from the group consisting of t-butyl and tetrahydropyranyl; M and n are each integers; and wherein $n/(m+n)$ ranges from about 0.1 to about 0.5. Also, a resist composition for use in a chemically amplified resist, which comprises a photoacid generator and a polymer having the formula:

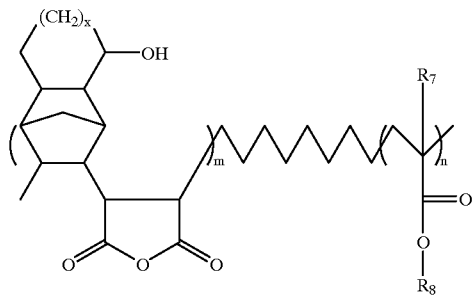

wherein x is selected from the group consisting of $C_5$ to $C_8$ cyclic or alicyclic composition, $R_7$ is selected from the group consisting of hydrogen and methyl; $R_4$ is selected from the group consisting of t-butyl, tetrahydropyranyl and adamantyl; m and n are each integers; and the ratio $n/(m+n)$ ranges from about 0.1 to about 0.5.

6 Claims, 4 Drawing Sheets

CHEMICALLY AMPLIFIED RESIST COMPOSITION

CROSS REFERENCE TO RELATED APPLICATION

This is a continuation-in-part of U.S. patent application Ser. No. 08/805,212 filed Feb. 27, 1997 allowed, which is hereby incorporated by reference in its entirety.

FIELD OF THE INVENTION

The present invention relates to polymers used in chemically amplified resist compositions, and resist compositions including such polymers.

BACKGROUND OF THE INVENTION

With increasing integration of semiconductor devices, there may be a heightened need to form finer patterns of subquarter micron capacity in photolithography processes. A photolitography technology has been proposed which may use an ArF excimer laser (e.g., $\lambda$=193 nm) for devices beyond the 1 giga capacity. This technology may be intended to replace conventional KrF excimer lasers using deep ultraviolet rays (e.g., $\lambda$=248 nm). Accordingly, it may be desirable to develop new chemically amplified resist compositions.

In general, the prerequisites for chemically amplified resist compositions for use with an ArF excimer laser may be as follows:

(1) transmittance in the range of 193 nm;
(2) excellent thermal characteristics, such as for example, high glass transition temperature ($T_g$);
(3) excellent adhesion to film materials;
(4) excellent resistance against a dry etching process; and
(5) capability of being developed using a conventional developer.

An example of one polymer which has been developed to possibly posses the above properties is a tetrapolymer, namely poly (IBMA-MMA-tBMA-MAA) which is represented by the general formula:

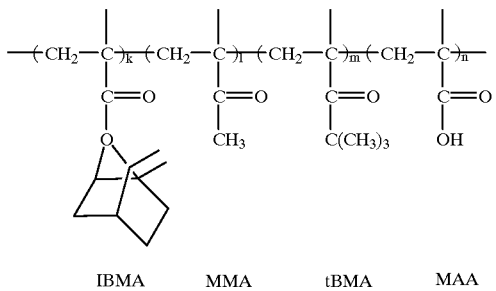

The above tetrapolymer may not be satisfactory. In particular, the tetrapolymer may have a very weak resistance against an etching process and may have weak adhesive properties. Additionally, a special developer may be needed for the development of the tetrapolymer. To potentially address the above problems, a class of cyclopolymers have been proposed which are of the general formula:

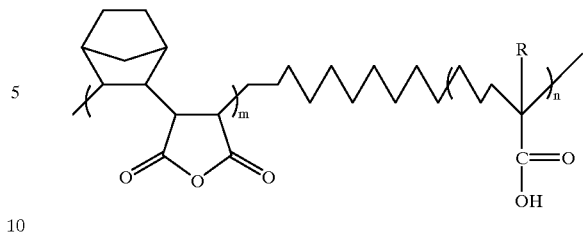

These cyclopolymers, however, also potentially suffer from drawbacks. Specifically, the cyclopolymers may have weak adhesive properties, and as a result lifting may possibly occur at the resist. Moreover, a special developer which may require separate preparation and may have to be employed in a specific concentration range might have to be used with the above cyclopolymers in place of generally accepted developers.

SUMMARY OF THE INVENTION

In view of the above, it is an object of the invention to provide polymers for use in chemically amplified resists which may be exposed to light using ArF lasers, may have strong resistances to dry etching processes, may possess excellent adhesion to film materials, and may be developed using conventional developers.

It is another object of the present invention to provide chemically amplified resists containing such polymers.

It is an additional object of the present invention to provide chemical amplified resists having excellent resistance against wet-etching.

Theses and other objects, features, and advantages of the present invention are provided by polymers for use in chemically amplified resists. In one aspect, the invention relates to copolymers for use in chemically amplified resists. The copolymers are of the general formula (I):

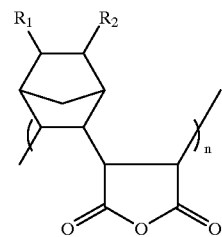

In the above formula (I), $R_1$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_2$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof; and n represents integers. The copolymers have weight average molecular weights ranging from about 3,000 to about 100,000.

In another aspect, the invention provides terpolymers for use in chemically amplified resists. The terpolymers are represented by the general formula (II):

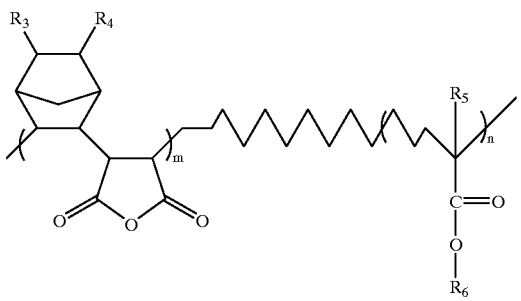

In the above formula (II), $R_3$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_4$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_5$ is selected from the group consisting of hydrogen and methyl. $R_6$ is selected from the group consisting of t-butyl and tetrahydropyranyl, and m and n each represent integers. The ratios n/(m+n) range from about 0.1 to about 0.5

In yet another aspect, the invention provides resist compositions which may include the copolymers and terpolymers described above.

In an additional aspect, the invention provides a resist composition for use in a chemically amplified resist, which comprises a photoacid generator and a polymer having the general formula (III):

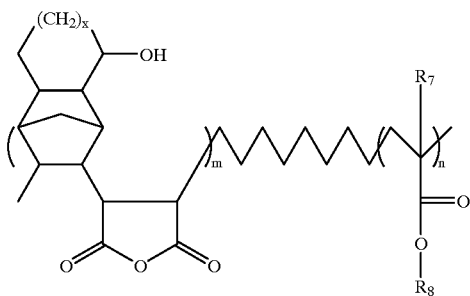

In the above formula (III), x is selected such that the ring containing $(CH_2)_x$ is selected from the group consisting of $C_5$ to $C_8$ cyclic or alicyclic composition. $R_7$ is selected from the group consisting of hydrogen and methyl. $R_8$ is selected from the group consisting of t-butyl, tetrahydropyranyl and adamantyl, and m and n are each integers. The ratios n/(m+n) range from about 0.1 to about 0.5.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1:
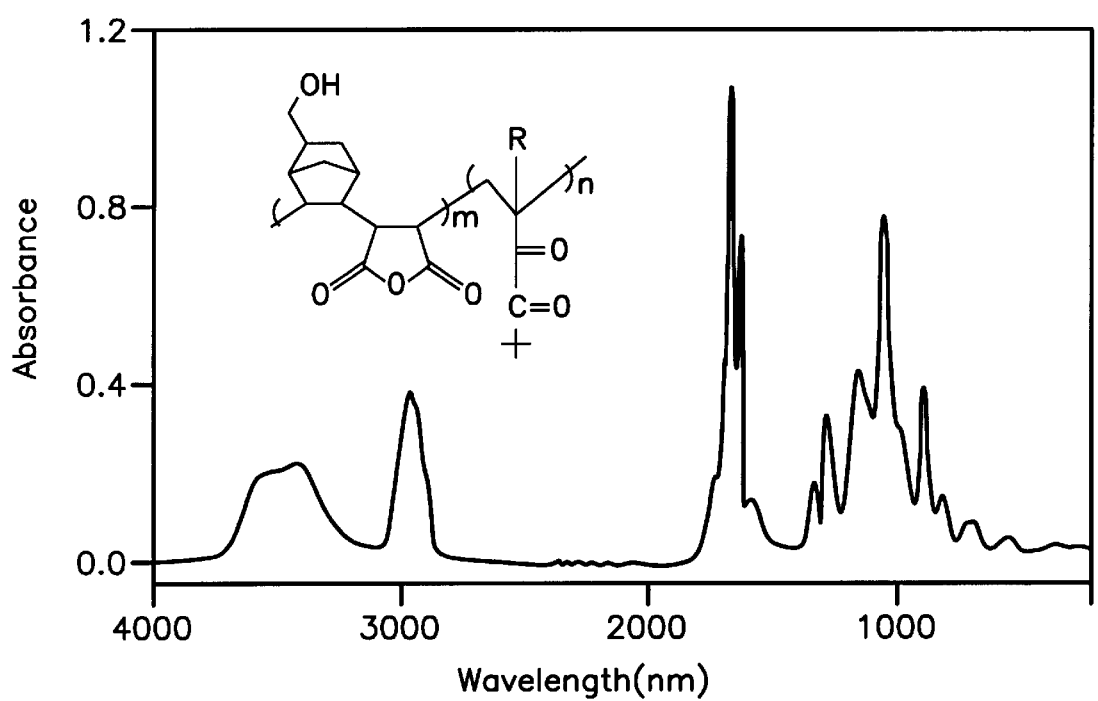
FIG. 1 represents a Fourier Transform Infrared Radiation (FTIR) spectrum of a terpolymer according to the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will convey the scope of the invention to those skilled in the art.

The invention relates to copolymers for use in chemically amplified resists. The copolymers are represented by the general formula (I):

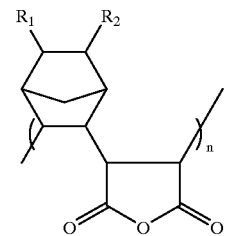

In the formula (I), $R_1$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof $R_2$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof; and n is an integer. The weight average molecular weights of the copolymers range from about 3,000 to about 100,000.

Referring to formula (I), in one embodiment, $R_1$ is hydrogen and $R_2$ is a $C_1$ to $C_{10}$ aliphatic hydrocarbon containing a hydroxy group. In a second embodiment, $R_1$ is hydrogen and $R_2$ is an aliphatic hydrocarbon of the formula —$CH_2OH$. In a third embodiment, $R_1$ is a $C_1$ to $C_{10}$ aliphatic hydrocarbon containing a hydroxy group and $R_2$ is a $C_1$ to $C_{10}$ aliphatic hydrocarbon containing a hydroxy group, wherein $R_1$ and $R_2$ may be the same of different. In a fourth embodiment, $R_1$ is a $C_1$ to $C_{10}$ aliphatic hydrocarbon containing a carboxylic acid group and $R_2$ is a $C_1$ to $C_{10}$ aliphatic hydrocarbon containing a carboxylic acid group, wherein $R_1$ and $R_2$ may be the same of different. In a fifth embodiment, $R_1$ is a $C_1$ to $C_{10}$ aliphatic hydrocarbon containing a carboxylic anhydride group and $R_2$ is a $C_1$ to $C_{10}$ aliphatic hydrocarbon containing a carboxylic anhydride group, wherein $R_1$ and $R_2$ may be the same of different.

The invention also relates to terpolymers for use in chemically amplified resists. The terpolymers are represented by the general formula(II):

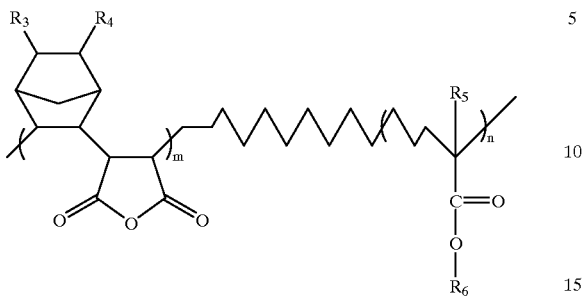

In formula(II), $R_3$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combinations thereof. $R_4$ is selected from the group consisting of hydrogen and $C_1$ to $C_{10}$ aliphatic hydrocarbons, with the aliphatic hydrocarbons containing substituents selected from the group consisting of hydrogen, hydroxy, carboxylic acid, carboxylic anhydride, and combination thereof. $R_5$ is selected from the group consisting of hydrogen and methyl. $R_6$ is selected from the group consisting of t-butyl and tetrahydropyranyl. And m and n each represents integers. The ratios n/(m+n) range from about 0.1 to about 0.5. Preferably, the weight average molecular weights of the terpolymers range from about 3,000 to about 100,000, and more preferably from about 5,000 to about 30,000.

Referring to formula(II), in one embodiment, $R_3$ is hydrogen and $R_4$ is a $C_1$ to $C_{10}$ aliphatic hydrocarbon containing a hydroxy group. In a second embodiment, $R_3$ is hydrogen and $R_4$ is an aliphatic hydrocarbon of the formula —$CH_2OH$. In a third embodiment, $R_3$ is a $C_1$ to $C_{10}$ aliphatic hydrocarbon containing a hydroxy group and $R_4$ is a $C_1$ to $C_{10}$ aliphatic hydrocarbon containing a hydroxy group, wherein $R_3$ and $R_4$ may be the same or different. In a fourth embodiment, $R_3$ is a $C_1$ to $C_{10}$ aliphatic hydrocarbon containing a carboxylic acid group and $R_4$ is a $C_1$ to $C_{10}$ aliphatic hydrocarbon containing a carboxylic acid group, wherein $R_3$ and $R_4$ may be the same or different. In a fifth embodiment, $R_3$ is a $C_1$ to $C_{10}$ aliphatic hydrocarbon containing a carboxylic anhydride group and $R_4$ is a $C_1$ to $C_{10}$ aliphatic hydrocarbon containing a carboxylic anhydride group, wherein $R_3$ and $R_4$ may be the same or different.

The invention also relates to resist compositions which may include the copolymers and terpolymers described herein and photoacid generators. The photoacid generators which may be preferable used include, but are not limited to, triarylsulfonium salt, diaryliodonium salt, sulfonates, and mixtures thereof. The resist compositions may include various amounts of polymers and photoacid generators. For example, in resist compositions containing terpolymers, photoacid generators may be present in amounts ranging from about 1 to about 20 weight percent based on the weights of the terpolymers. Preferably, the weight average molecular weights of terpolymers used in the resist composition range from about 5,000 to about 20,000.

Although Applicants do not wish to be bound by and one theory, it is believed that an exposure mechanism of a polymer provided by the invention may be illustrated by the following reaction:

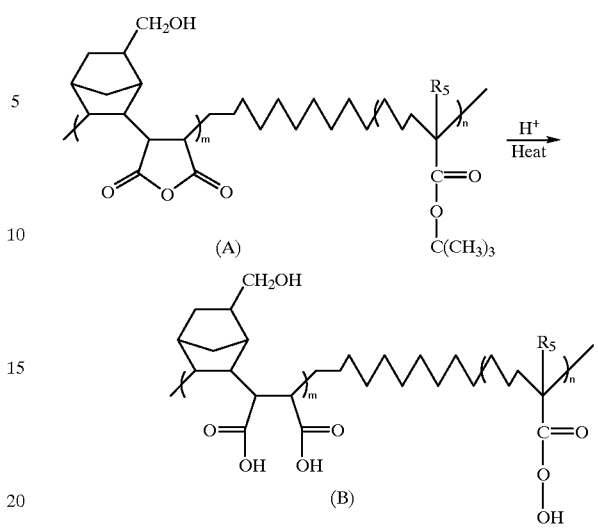

In the above mechanism, the polymer(A) before exposure is not very soluble in a developer, while the polymer (B) formed as a result of exposure is highly soluble in a developer.

Resist compositions using the copolymers and terpolymers of the invention are highly advantageous. The resist compositions may have excellent resistance to dry etching processes. The resist compositions also may possess excellent adhesion to film materials. Additionally, conventional developers, e.g., a 2.38 wt % TMAH developer, may be used with the resist compositions.

The following examples are to be construed as illustrative of the present invention, and not as a limitation thereon.

EXAMPLE 1

Synthesis of Copolymer

The synthesis reaction of a copolymer according to this embodiment can be represented by the following formula:

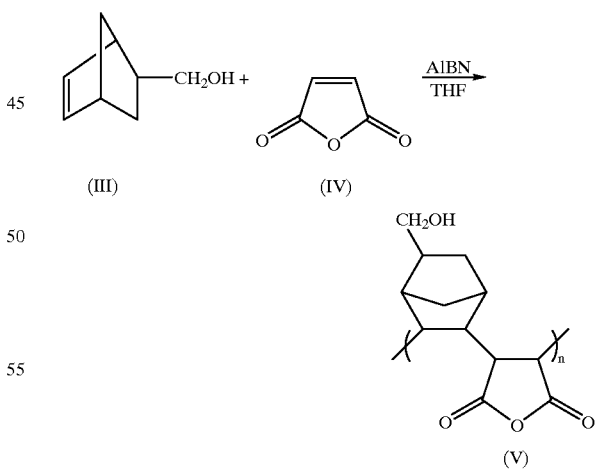

In this synthesis, 12.4 g (0.1 mol) of 5-norbornene-2-methanol (III) and 9.8 g (0.1 mol) of maleic anhydride (IV) were dissolved in 100 ml of tetrahydrofuran (THF) together with 1.31 g (0.008 mol) of 2.2 azobisisobutyronitrile (AIBN). The reactants were purged with nitrogen ($N_2$) gas at a temperature of 65–70° C. for about 24 hours so as to form the reaction product.

After polymerization, the reaction product was precipitated in n-hexane and the precipitates were dried in a vacuum oven maintained at 50° C. for about 24 hours to obtain copolymer (V) product (yield: 70%). The weight-average molecular weight of the obtained reaction product was 4,500 and the polydispersity (weight-average molecular weight/number average molecular weight) was 2.5.

The result of the FTIR spectral analysis for the thus-obtained copolymer (V) product was as follows:

FTIR (KBr): 3400 cm$^{-1}$(—OH), 1782 cm$^{-1}$(C=O).

EXAMPLE 2

Synthesis of Copolymer

The synthesis reaction of a copolymer according to this embodiment can be represented by the following formula:

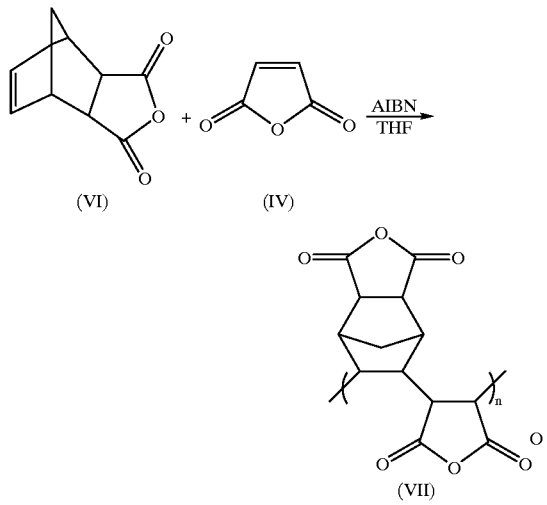

In this embodiment, 16.4 g (0.1 mol) of 5-norbornene-2,3-dicarboxylic acid (VI) and 9.8 g (0.1 mol) or maleic anhydride (IV) were dissolved in 120 ml of tetrahydrofuran (THF), and 1.31 g (0.008 mol) of AIBN was added thereto. The product was polymerized under the nitrogen (N$_2$) gas ambient at 65–70° C. for about 24 hours.

After polymerization, the reaction product was precipitated in n-hexane and the precipitates were dried in a vacuum oven maintained at 50° C. for about 24 hours to obtain copolymer (VII) product (yield: 70%).

The weight-average molecular weight of the obtained reaction product was 5,500 and the polydispersity was 2.4.

EXAMPLE 3

Synthesis of Terpolymer

The synthesis reaction of a terpolymer according to this embodiment can be represented by the following formula:

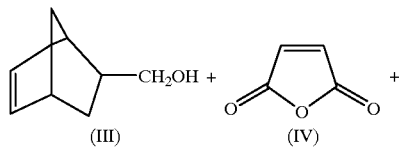

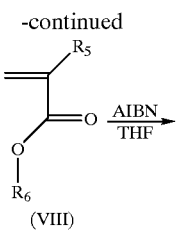

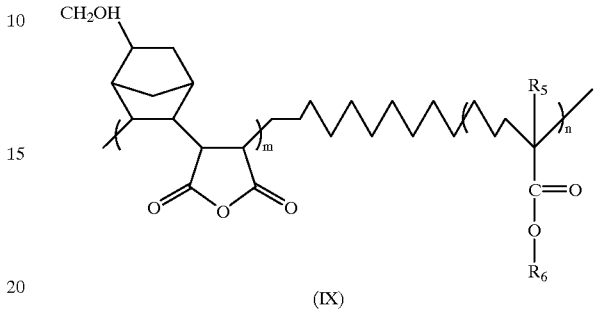

where R$_5$ is hydrogen or methyl, and R$_6$ is t-butyl or tetrahydropranyl group.

A. Synthesis of terpolymer wherein R$_6$ is a t-butyl group.

12.4 g (0.1 mol) of 5-norbonene-2-methanol (III), 9.8 g (0.1 mol) of maleic anhydride (IV), and 14 g (0.1 mol) of t-butyl methacrylate (VII) were dissolved in 150 ml of tetrahydrofurane (THF), and 1.64 g (0.01 mol) of AIBN was added thereto. The product was polymerized at a temperature of 65–70° C. for about 24 hours.

After polymerization, the reaction product was precipitated in n-hexane and the precipitates were dried in a vacuum oven maintained at 50° C. for about 24 hours to obtain terpolymer (IX) product (yield: 70%). The weight-average molecular weight of the obtained reaction product was 6,000, the polydispersity was 2.4, and the glass transition temperature (Tg) was 135° C.

FIG. 1 represents a Fourier Transform Infrared Radiation (FTIR) spectrum of the terpolymer (IX) obtained in the above manner and the result of the analysis was as follows.

IR (Kbr):3400 cm$^{-1}$(—OH), 1784 cm$^{-1}$(C=O), 1722 cm$^{-1}$(C—O).

B. Synthesis of terpolymer wherein R$_6$ is a tetrahydropyranyl group

Terpolymer (IX) was obtained in a manner similar to that described in case A, except that 17 g (0.1 mol) of tetrahydropyranyl methacrylate was used instead of t-butyl methacrylate. The yield of the terpolymer (IX) was 70%. The weight-average molecular weight of the obtained reaction product was 5,500, and the polydispersity was 2.3.

The result of the FTIR spectral analysis of the thus-obtained terpolymer (IX) product was as follows:

IR (Kbr): 3400 cm$^{-1}$(—OH), 1784 cm$^{-1}$(C=O), 1723 cm$^{-1}$(C=O).

EXAMPLE 4

Synthesis of a Resist Composition 1 g of the terpolymer (IX) obtained from Example 3 was dissolved in 7 g of propylene glycol monomethyl ether acetate (PGMEA). 0.02 g of triphenyl sulfonium triflate was added thereto. The mixture was stirred thoroughly. Then, the resist composition was obtained by filtering the mixture using a 0.2 μm microfilter. The obtained resist composition was applied to a wafer to form a coating film of about 0.5 μm on the wafer.

The wafer having the coating film was baked at about 140° C. for about 90 seconds, exposed to light using a KrF excimer laser having a numeric aperture of 0.45 and then baked again at about 140° C. about 90 seconds, Thereafter, the resultant was developed for about 60 seconds using about 2.38 wt % of tetramethyl ammonium hydroxide (TMAH) solution.

A photoresist pattern was formed on a semiconductor substrate by exposing the film of resist composition using an exposure source having an energy of 31 mj/cm$^2$ and a wavelength of 200 nm. When the film was developed, excellent cross-sectional profiles were obtained at the respective wavelength bands.

Figure 2:
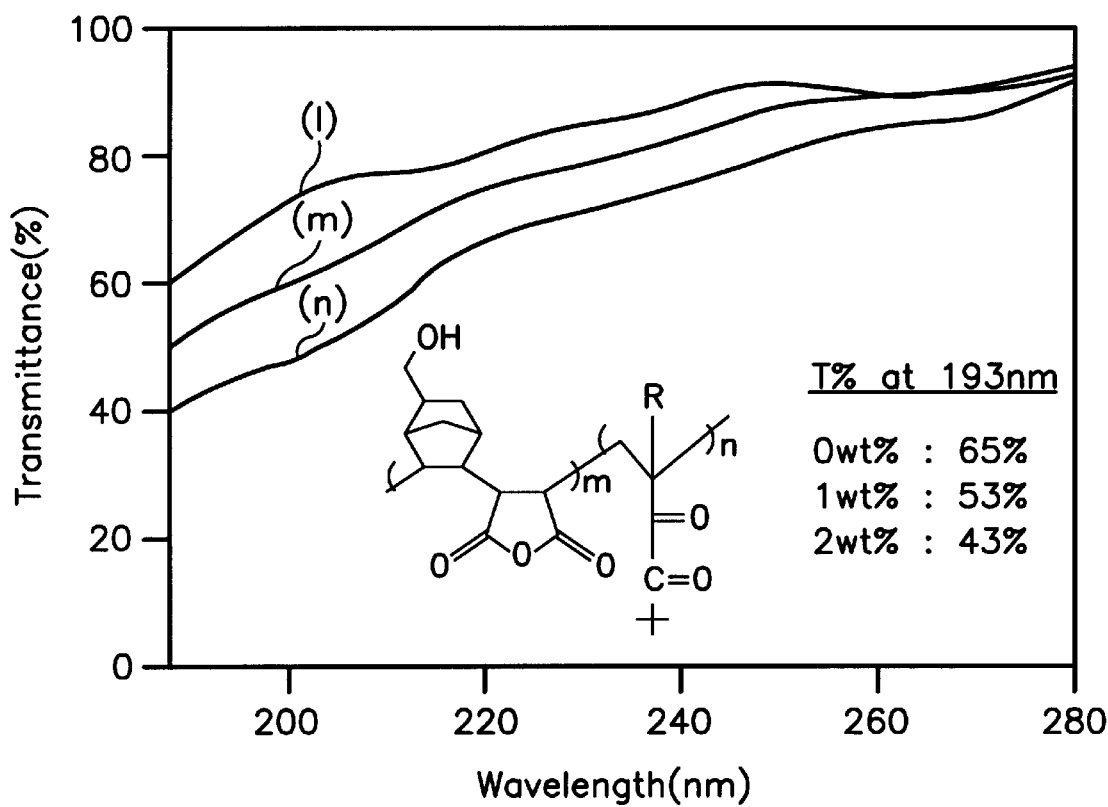
FIG. 2 is a graph illustrating the measured transmittance depending on the respective wavelengths of an ultraviolet (UV) spectrum for a resist composition according to the present invention.
Figure 3:
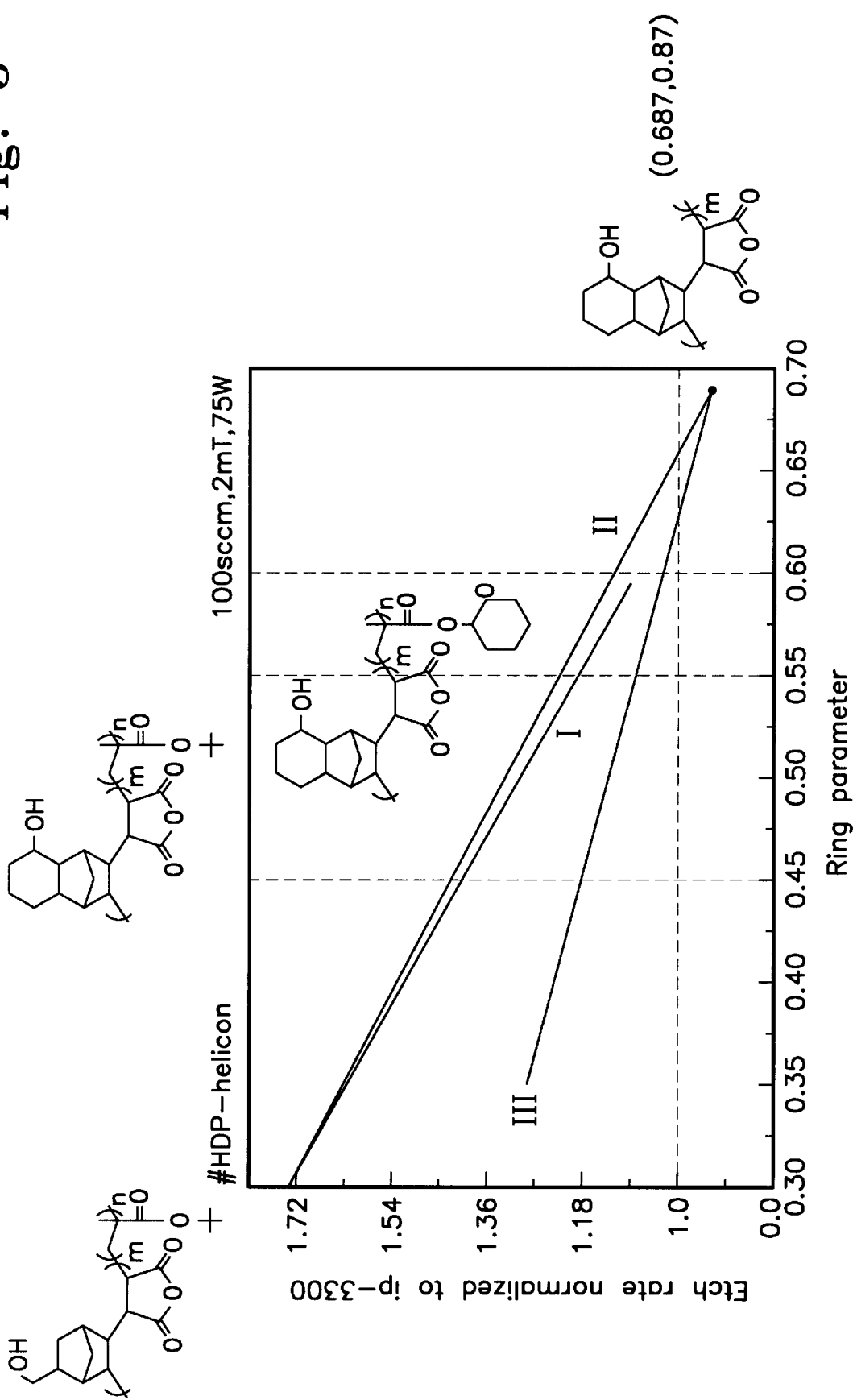
FIG. 3 is a graph illustrating the measured etch resistance of poly(OL/MA-tBMA) as simulation results using Ring Parameter simulation for the poly(OL/MA-tBMA) according to the present invention.

FIG. 2 is a graph illustrating the measured transmittance versus the wavelengths of an ultraviolet(UV) spectrum for the resist composition according to the present invention. In FIG. 2, curve (1) indicates the transmittance of a pure resist composition to which the PAG is not added, curve (m) indicates the transmittance of a resist composition to which the PAG is added at a level of 1 wt % and curve (n) indicates the transmittance of a resist composition to which the PAG is added at a level of 2 wt %. As can be seen in FIG. 3, at a wavelength of 193 nm, the measured transmittances of (1) the pure resist composition, (2) the resist composition with 1 wt % PAG added thereto, and (3) the resist composition with 2 wt % PAG added thereto were 65%, 53% and 43%, respectively.

EXAMPLE 5

The poly(octalol/maleicanhydride-tert-butylmethymethacrylate: OL/MA-tBMA) according to this embodiment can be obtained by following synthesis steps.

A. Synthesis of Octalone Monomer

The synthesis reaction of octalone monomer according to this embodiment can be represented by the following formula:

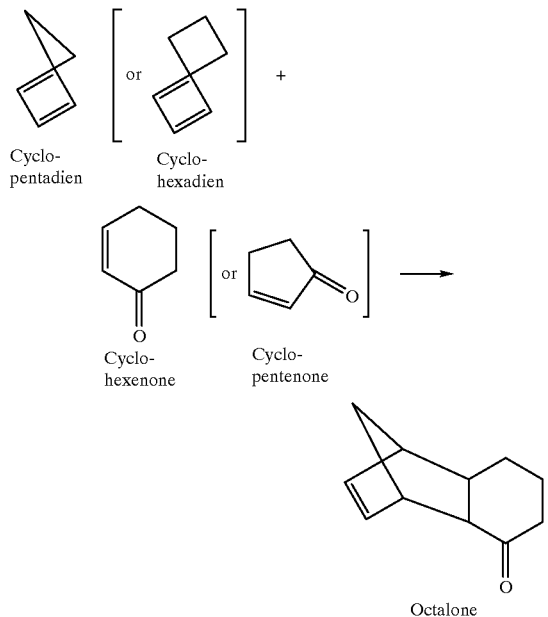

4.8 g (50 mmol) of 2-cyclohexanone dissolved in 100 ml of dry toluene and 1.66 g (12.5 mmol) of aluminum chloride dissolved in 100 ml of dry toluene were added thereto. The mixture was purged with nitrogen (N$_2$) gas and stirred thoroughly at a room temperature for about 60 minutes. Also, 19.8 g (300 mmol) of cyclopentadien dissolved in dry toluene was added to the stirred mixture. The reactants reacted to one another at a temperature of about 40° C. for about 7 hours so as to form the reaction product.

After mixing the reaction product with cooling water, a process step for extracting the reaction product was carried out using ethylether solution. Then, the reaction product was extracted by cleaning it with saturated brine and drying it with MgSO$_4$. Next, moisture in the reaction product was removed by evaporation under vacuum. Finally, the resulting product was placed in a solution having a 9:1 ratio of hexane to ether, and the octalone monomer was extracted by passing the solution through column chromatograph. The octalone monomer thus produced had diastereoisomer of two types, e.g., endo and exo, and had characteristics as listed hereunder.

| IR: 3,060 (Olefinic CH), | 1,700 (C=O) C$_m^{-1}$ | |
|---|---|---|
| $^1$H No.: δ 0.7~0.9(1H, 4), | 1.2~1.5(2H, CH$_2$ Bridge) | |
| 1.6~1.85(2H, 3), | 1.85~1.9(1H, 2), | 1.9~2.0(1H, 4) |
| 2.31(1H, 2), | 2.6~2.73(2H, 9, 10), | 2.88(1H, 5) |
| 3.26(1H, 8), | 6.01~6.17(2H, 6, 7) | |

B. Synthesis of Octalol Monomer

The synthesis reaction of octalol monomer according to this embodiment can be represented by the following formula:

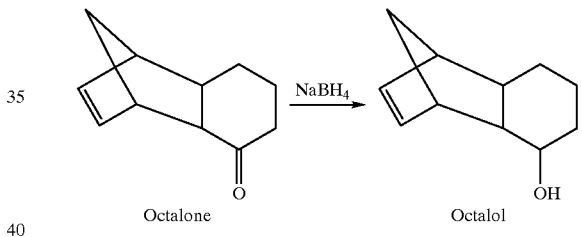

3.783 g (0.1 mol) of sodium borohydride (NaBH$_4$) was dissolved in 200 ml of diethylether and then the octalone monomer obtained from Synthesis step (A) was instilled thereto so as to form a reaction product. The reaction product was refluxed for about 12 hours, and subsequently fell into a lot of water so that it was neutralized with HCl solution. Then, diethylether was added to the neutralized solution and thereby the reaction product can be extracted from the neutralized solution. After drying the reaction product with MgSO$_4$, moisture in the reaction product was evaporated under vacuum, so that octalol monomer can be extracted. The octalol monomer thus produced has characteristics as listed hereunder.

| IR: 3,619 (Alcoholic CH), | 3,060 (Olefinic CH)C$_m^{-1}$ | |
|---|---|---|
| $^1$H No.: δ 2.8~2.9(2H, 6, 11), | 6.1~6.3(2H, 8, 9) | 4.1(1H, 1) |

C. Synthesis of Poly(OL/MA-tBMA)

The synthesis reaction of poly(OL/MA-tBMA) according to this embodiment can be represented by the following formula:

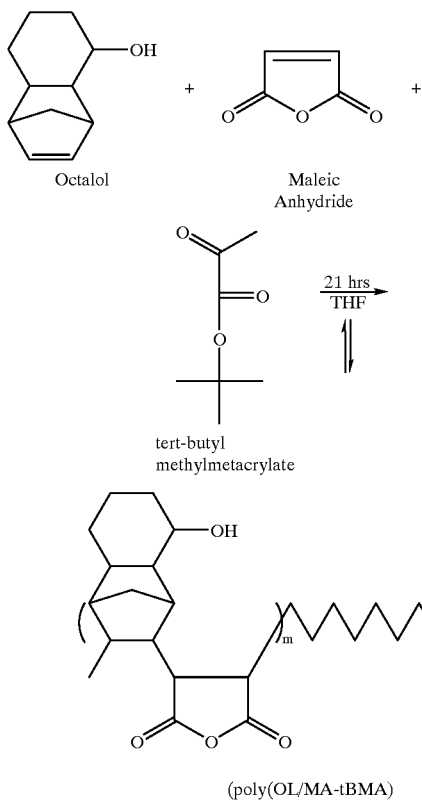

(poly(OL/MA-tBMA))

6.569 g (20 mmol) of octalol, 5.884 g (60 mmol) of maleic anhydride, and 2.84 g (20 mmol) of t-BMA (tert-butylmethylmethacrylate) were mixed to 62 ml of tetrahydrofuran (THF) and refluxed with 1 mol % of polymerization initiator at a temperature of about 70° C. for about 21 hours so as to form a reaction product. After cooling the reaction product, it was precipitated in n-hexane solution and dried in a vacuum dry oven for about 24 hours. As a result, poly(OL/MA-tBMA) serving as a base polymer was obtained.

In the formula, $R_7$ is selected from the group consisting of hydrogen and methyl, $R_8$ is selected from the group consisting of t-butyl, tetrahydropyranyl and adamantyl, and m and n are each integers. The ratios n/(m+n) range from about 0.1 to about 0.5.

The resist composition comprises from about 0.5 to 10 weight percent of the photoacid generator which is based on the weight of the polymer defined by the formula and which is selected from the group consisting of triarylsulfonium salt, diaryliodonium salt, and mixtures thereof. The polymer has a weight average molecular weight of from about 2,000 to about 100,000. The triarylsulfonium salt may be selected from the group consisting of triphenyltriflate, triphenylantimonate, methoxytriphenyltriflate, methoxytriphenylantimonate, trimethyltriphenyltriflate, and naphthalenetriflate. The diaryliodonium salt may be selected from the group consisting of diphenyliodoniumtriflate, methoxyphenyliodoniumantimonate, methoxyphenyliodoniumtriflate, di-t-butylbisphenylantionate, and di-t-butylbisphenyltriflate.

FIG. 3 is a graph illustrating the measured etch resistance of poly(OL/MA-tBMA) as simulation results using Ring Parameter simulation for the poly(OL/MA-tBMA) according to the present invention. In FIG. 3, line (I) indicates an etch rate of a conventional polymer to which maleic anhydride is added, line (II) indicates a minimum etch resistance of the poly(OL/MA-tBMA) as simulation results and line (III) indicates an etch resistance of the poly(OL/MA-tBMA) which was actually presumed.

Figure 4:
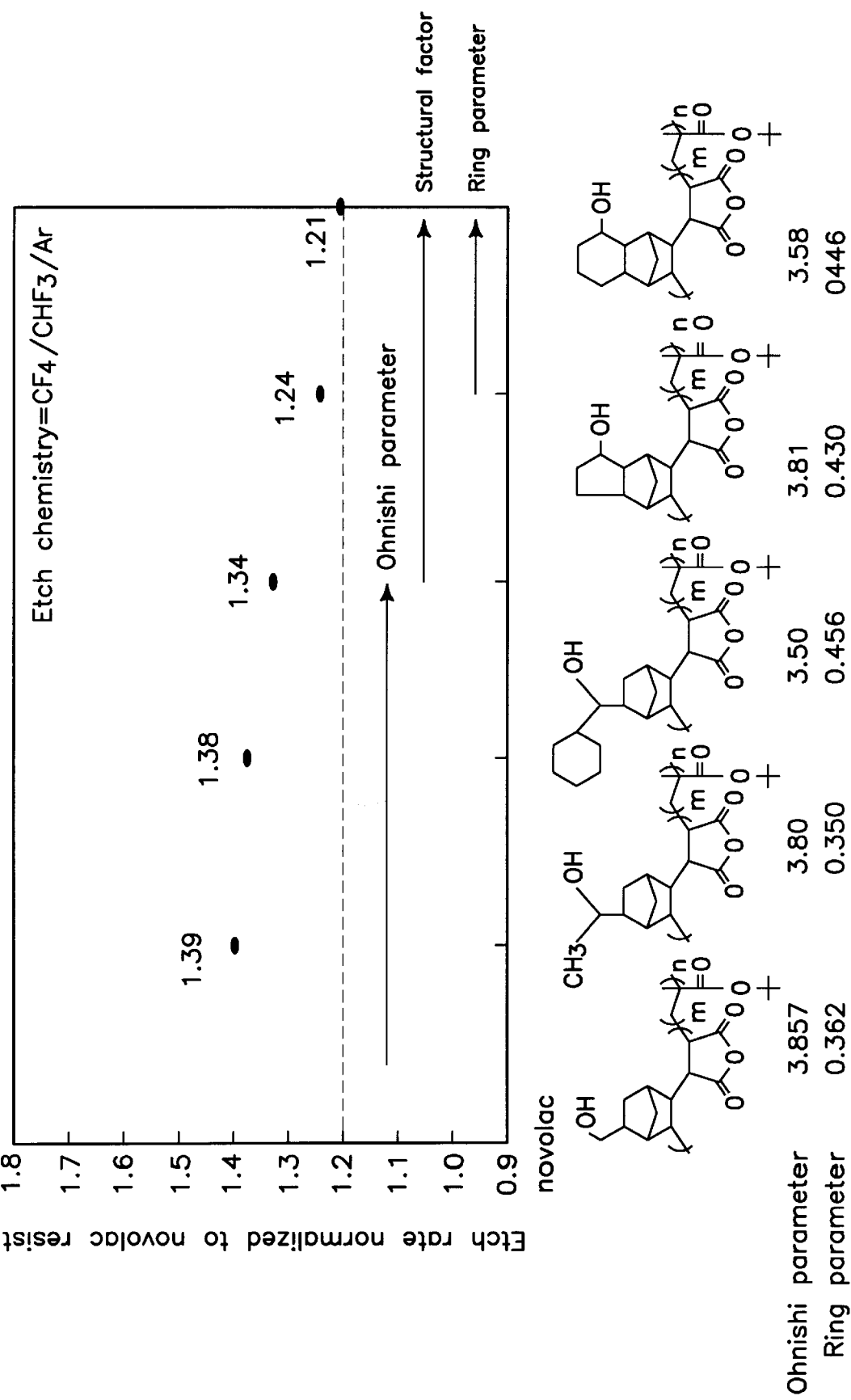
FIG. 4 is a graph illustrating the measured etch rate of the poly($OL_{40}$/$MA_{60}$-$tBMA_{20}$) as simulation results using Ohnishi and Ring Parameters for the poly ($OL_{40}$/$MA_{60}$-$tBMA_{20}$) according to the present invention.

FIG. 4 is a graph illustrating the measured etch rate of the poly($OL_{40}/MA_{60}$-$tBMA_{20}$) as simulation results using Ohnishi and Ring Parameters for the poly ($OL_{40}/MA_{60}$-$tBMA_{20}$) according to the present invention. The simulation results shown in FIG. 4 can be obtained using $CF_4/CHF_3/Ar$ as an etch chemistry for the etch rate test. This test was carried out under the conditions of each 20/35/50 SCCM's, 60 mT, and 80 G in the test equipment called "MERIE type P-5000".

As can be seen from FIGS. 3 and 4, the conventional ArF resist has an etch rate of about 1.39, but the poly(OL/MA-tBMA) according to the present invention has an etch rate between 1.24 and 1.21. Therefore, the poly(OL/MA-tBMA) of the present invention can have excellent etch resistance in addition to excellent adhesion.

What is claimed is:

1. A resist composition for use in a chemically amplified resist, said resist composition comprising a photoacid generator and a polymer having the formula:

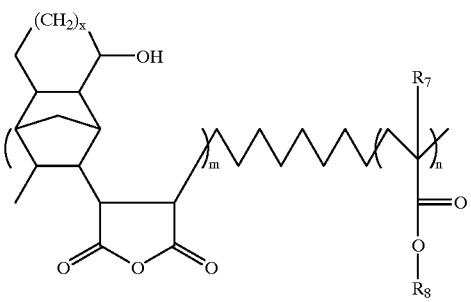

Wherein x is selected such that the ring containing $(CH_2)_x$ is selected from the group consisting of $C_5$ to $C_8$ cyclic or alicyclic composition, wherein $R_7$ is selected from the group consisting of hydrogen and methyl;

$R_8$ is selected from the group consisting of t-butyl, tetrahydropyranyl and adamantyl;

m and n are each integers; and wherein n/(m+n) ranges from about 0.1 to about 0.5.

2. A resist composition according to claim 1, wherein said resist composition comprises from about 0.5 to 10 weight percent of said photoacid generator based on the weight of said polymer defined by the formula (III).

3. A resist composition according to claim 1, wherein said photoacid generator is selected from the group consisting of triarylsulfonium salt, diaryliodonium salt, and mixtures thereof.

4. A resist composition according to claim 1, wherein said polymer has a weight average molecular weight of from about 2,000 to about 100,000.

5. A resist composition according to claim 3, wherein said triarylsulfonium salt is selected from the group consisting of triphenyltriflate, triphenylantimonate, methoxytriphenyltriflate, methoxytriphenylantimonate, trimethyltriphenyltriflate, and naphthalenetriflate.

6. A resist composition according to claim 3, wherein said diaryliodonium salt is selected from the group consisting of diphenyliodoniumtriflate, methoxyphenyliodoniumantimonate, methoxyphenyliodoniumtriflate, di-t-butylbisphenylantionate, and di-t-butylbisphenyltriflate.

* * * * *